United States Patent [19]

Campbell, Jr. et al.

[11] 3,847,690

[45] Nov. 12, 1974

[54] METHOD OF PROTECTING AGAINST ELECTROCHEMICAL EFFECTS DURING METAL ETCHING

[75] Inventors: James F. Campbell, Jr.; Arthur E. Engvall, both of Sunnyvale; Arthur E. Lewis, Los Altos, all of Calif.

[73] Assignee: Fairchild Camera and Instrument Corporation, Syosset, N.Y.

[22] Filed: Oct. 24, 1973

[21] Appl. No.: 409,126

Related U.S. Application Data

[63] Continuation of Ser. No. 135,442, April 19, 1971, , which is a continuation of Ser. No. 740,935, June 28, 1968, abandoned.

[52] U.S. Cl. .......................... 156/13, 29/580, 156/17

[51] Int. Cl. .......................... H01l 7/00

[58] Field of Search ........ 29/580, 589, 590; 156/17, 156/13, 11

[56] References Cited

UNITED STATES PATENTS

| | | | |
|---|---|---|---|
| 2,952,896 | 9/1969 | Cornelius et al. | 156/17 |
| 3,261,074 | 7/1966 | Beauzee | 29/589 |
| 3,313,013 | 4/1967 | Last | 29/580 |
| 3,661,727 | 5/1972 | Itoh et al. | 156/17 |

*Primary Examiner*—Douglas J. Drummond
*Assistant Examiner*—J. W. Massie
*Attorney, Agent, or Firm*—Alan H. MacPherson; Roger S. Borovoy

[57] ABSTRACT

The differential etch rate between metals connected by differing resistivity paths to the backside of a semiconductor wafer is eliminated by coating with insulation the normally uninsulated surfaces of the wafer prior to submerging the wafer in the etch solution.

1 Claim, 8 Drawing Figures

INVENTORS
JAMES F. CAMPBELL JR
ARTHUR E. ENGVALL
ARTHUR E. LEWIS

BY Roger L. Borovoy
Alan H. MacPherson
ATTORNEYS

INVENTORS
JAMES F. CAMPBELL JR.
ARTHUR E. ENGVALL
ARTHUR E. LEWIS
BY Roger S. Borovoy
Alan H. MacPherson
ATTORNEYS

METHOD OF PROTECTING AGAINST ELECTROCHEMICAL EFFECTS DURING METAL ETCHING

CROSS-REFERENCE TO RELATED APPLICATION

This is a continuation of U.S. Pat. application Ser. No. 135,442 filed Apr. 19, 1971 now abandoned and entitled "Method of Protecting Against Electrochemical Effects during Metal Etching." Application Ser. No. 135,442 in turn was a continuation of application Ser. No. 740,935 filed June 28, 1968 now abandoned, with the same title.

BACKGROUND OF THE INVENTION

1. Field of the Invention

This invention relates to the etching of semiconductor devices and in particular, to a method of eliminating the differential etch rate between a metal in contact with an underlying semiconductor substrate and a metal insulated from this substrate, or between metal areas in contact with semiconductor regions of differing resistivities.

2. Description of the Prior Art

Etchants are commonly used in the manufacture of semiconductor devices to remove unwanted portions of metal, dielectric, or even of the semiconductor material itself. Recently it has been observed that when several different regions of metal on a semiconductor substrate are being etched, the etch rate is faster on the metal in contact with the underlying substrate than it is on the metal insulated from the underlying substrate. This is an undesirable effect because it means that by the time all the desired metal has been removed from the slower-etching regions, the faster-etching metal will have been over-etched and undercut excessively. Failures of semiconductor devices to meet design standards have been attributed to this so-called "differential etch rate."

SUMMARY OF THE INVENTION

This invention overcomes this differential etch rate. We have discovered that the semiconductor substrate and the metal to be etched, when placed in the etch solution, form plates of an electrochemical cell in which the metal is biased negatively. More rapid etching of that metal in contact with the substrate than of the metal insulated from the substrate then occurs because of the flow of current between the metal and the substrate. The method of this invention overcomes this differential etching and provides substantially uniform etching regardless of whether or not the metal is in contact with the substrate.

According to this invention, a wafer to be etched, composed of a substrate with overlying layers of insulation and metal, is masked in the usual manner with the region to be etched left exposed. Then selected, normally uninsulated, surfaces of the wafer — typically, but not limited to, its backside and edges — are coated with a suitable insulation selected to both withstand the attack of the etch solution and to adhere to the wafer surfaces. The insulation-coated wafer is then submerged in the etch solution. Upon completion of the etching, the wafer is removed from the etch solution and rinsed. The insulation is often, but not necessarily, removed prior to further processing.

Alternatively, when metal is being etched, the backside and the edges of the to-be-etched wafer are coated with a metal having the same electrochemical potential at the metal being etched. This is typically a metal identical to but of greater thickness than the to-be-etched metal. The etching is then carried out as before. Because the metal coating is at the same potential as the metal being etched, no electrochemical effect exists and the etching of the metal is uniform. The etching is stopped when the desired metal has been removed.

Interestingly, selectively coating the normally uninsulated surfaces of the wafer with insulation prevents the differential attack of underlying metal when the material being etched is an overlying layer of another material such as a dielectric.

The insulation coating of this invention effectively prevents the flow of current from the material being etched to the underlying substrate. As a result, the etching proceeds smoothly and substantially uniformly over the surface of all the material being etched.

This invention will be more fully understood in light of the following detailed description taken together with the attached drawings.

DESCRIPTION OF THE PREFERRED EMBODIMENTS

The principles of this invention are best described with the aid of the process shown in FIGS. 1–8. While this invention will be described in terms of a substrate of silicon with evaporated aluminum leads placed thereon, the method of this invention is not limited to these particular materials and can be used to prevent differential etching in a large number of substrate-metal combinations.

Figure 1:
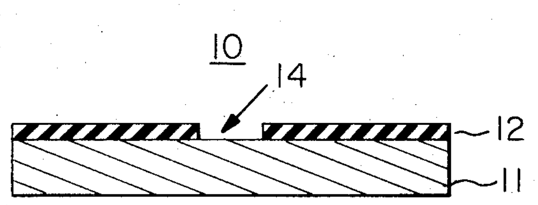
FIGS. 1–8 show various stages of one process using the principles of this invention for converting a substrate and the associated insulating and conducting layers into a semiconductor device.

In FIG. 1, substrate 11 of silicon has grown on it an insulating layer 12 of silicon dioxide. Techniques for the growth of such a layer are well-known and thus will not be described in detail. A midregion 14 of the silicon dioxide layer 12 is removed by well-known masking and etch techniques.

Figure 2:
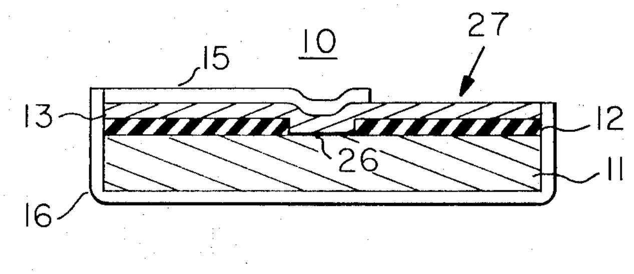

Next, as shown in FIG. 2, a layer 13 of aluminum is evaporated over both dielectric 12 and the exposed region 14 of silicon 11. An electrical contact is formed over region 14 between aluminum 13 and silicon 11. Throughout the remainder of this specification substrate 11, together with any attached insulation and metal layers, will be called "wafer 10."

Next, as shown in FIG. 2, the top of wafer 10 is masked, in a well-known manner, so that masking material 15 covers a selected portion of aluminum 13 while region 27 of aluminum 13 is left exposed.

However, before wafer 10 is placed in the etch solution, a coating 16 of a suitable insulating material, typically Kodak metal etch resist, known as KMER, is placed on the backside and edges of wafer 10 as shown in FIG. 2. This coating is typically 2 micrometers or more thick. The resulting coated wafer is then submerged in an etch solution for a preselected period of time. An appropriate etch for aluminum is phosphoric acid. In an etch of phosphoric acid at 70° centigrade the aluminum is etched at a rate of about 300 angstroms per second. Upon completion of the etching the wafer is removed from the etch solution and rinsed in de-ionized water.

Figure 3:
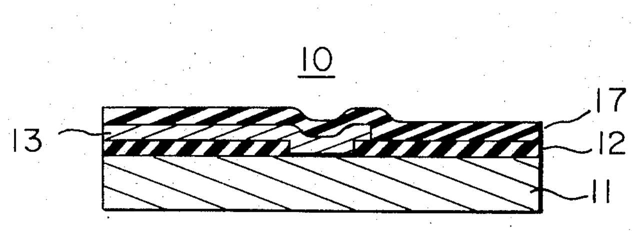

Next, mask 15 and coating 16 are removed and a layer 17 of dielectric, shown in FIG. 3, is placed over both insulating layer 12 and the remaining aluminum 13. Dielectric 17 is typically deposited by well-known sputtering techniques. The heat generated by this sputtering decreases the resistivity of the contact in region 14 between aluminum 13 and silicon 11.

Figure 4:
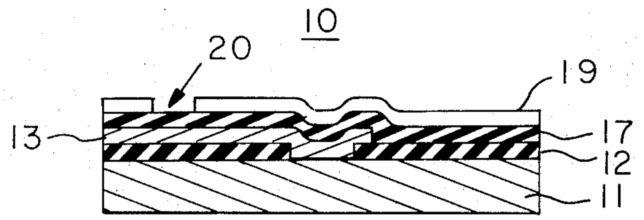
Figure 5:
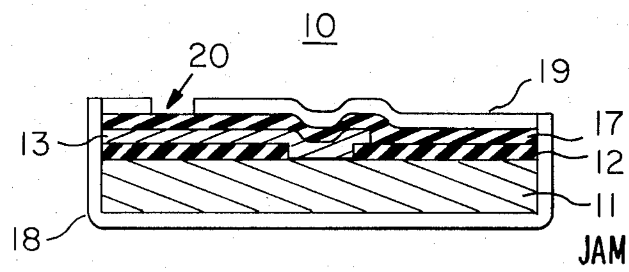
Figure 6:
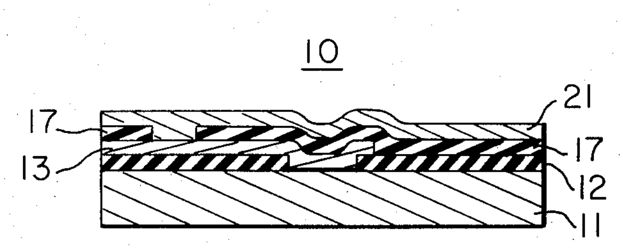

To contact aluminum 13 through dielectric 17 a hole must be etched in the dielectric. To do this, dielectric 17 is covered in a well-known manner with mask 19 containing a hole 20, as shown in FIG. 4. Next, insulating coating 18, typically KMER, is placed on the backside and edges of wafer 10 as shown in FIG. 5. Then, the insulated wafer is submerged in an etchant for a time necessary to etch through that portion of dielectric 17 underneath region 20 and thus make contact with aluminum 13. A suitable etch for $SiO_2$ dielectric is buffered hydrofluoric acid. An etch of 7.2% HF and 35% $NH_4F$ takes about 5 minutes at room temperature to etch through about 1 micrometer of dielectric. Coating 18 also prevents the differential attack of the aluminum layer 13 by the dielectric etch when this etch has eaten through dielectric 17.

Upon completion of the etching of dielectric layer 17, wafer 10 is removed from the etch, rinsed, and stripped of coating 18 and mask 19.

Aluminum layer 21 (FIG. 6) is then evaporated on top of dielectric layer 17. Layer 21 contacts underlying aluminum layer 13 through the previously etched hole in dielectric 17. Layer 21 will, upon completion of the device, provide through aluminum 13 the electrical connection to an active region of a semiconductor device (not shown) contained in silicon 11.

Figure 7:
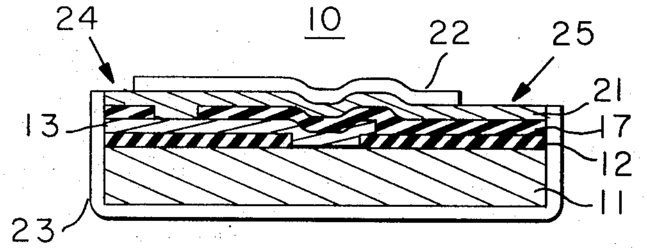
Figure 8:
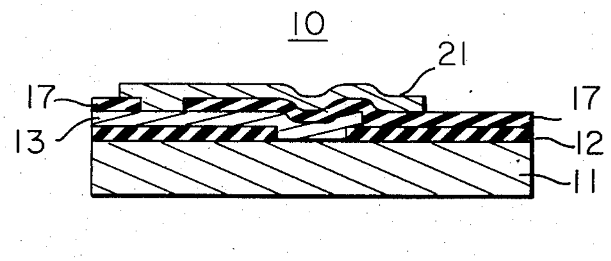

Aluminum layer 21 must be selectively etched to provide the properly shaped contacts and electrical leads to silicon 11. To do this, mask 22 is placed on top of layer 21. As shown in FIG. 7, regions 24 and 25 are left unmasked. This can be done by well-known photolithographic techniques. Then coating 23 of insulating material, for example, KMER, is placed on the backside and edges of the semiconductor wafer 10. The resulting coated wafer is again submerged in a suitable aluminum etch, for example, a phosporic acid solution. The aluminum beneath regions 24 and 25 is rapidly removed. When the desired etching has been accomplished, the wafer is taken from the etch solution, rinsed, and mask 22 together with insulation layer 23 are removed. The resulting processed wafer is shown in FIG. 8.

Because of the insulating coatings 16 and 23 placed on the uninsulated surfaces of wafer 10 at different times throughout its processing, the etching of the aluminum layers 13 and 21 is surprisingly uniform. Failures in the resulting device due to differential etch rates are thus appreciably reduced resulting in significant production economies and enhanced reliability.

Moreover, because of coating 18 (FIG. 5), aluminum layer 13 is not differentially attacked by the dielectric etch used to create the contact hole through dielectric 17.

Although the process shown in FIGS. 1–8 uses KMER for the insulating coating required by this invention, this coating can be composed of any other appropriate insulating material, such as black wax, lacquer, adhesive tape, silicon dioxide or other dielectric. Because some of these insulating materials are not removed by the techniques which remove the etching masks placed on the frontside of wafer 10, these insulation coatings will not have to be replaced as often as coatings used in the process of FIGS. 1–8.

While one process using the principles of this invention has been described, other processes for implementing the principles of this invention are possible. For example, usually a silicon substrate such as the substrate 11 shown in FIG. 1, has its PN junctions and active regions already formed prior to the growing of the dielectric, metal, or insulation layers on the top or "frontside" of this substrate. During the thermal growth of the silicon dioxide layer 12 on top of substrate 11 (FIG. 1) a layer of silicon dioxide (not shown) is also grown on the edges and bottom or "backside" of substrate 11, except for those portions of the substrate surface contacting the furnace boat.

Usually, to etch contact regions such as region 14 (FIG. 1), in the silicon dioxide on the frontside of wafer 10, a mask of photoresist material is placed over this silicon dioxide layer at all points except the regions to be etched. However, this mask does not extend over the edges and backside of the wafer. As a result, upon submerging the wafer in the etch solution, the silicon dioxide on the edges and backside of the wafer is removed along with the silicon dioxide in the contact region. The removal of the backside silicon dioxide is necessary when a diffusant is to be introduced into the wafer substrate through the backside of the wafer. And, if a diffusant is alloyed to the backside of the wafer, it is often impossible to grow silicon dioxide on the backside of the wafer. However, in those situations where a diffusant is not alloyed to the backside of, or introduced into, the silicon wafer 10, the method of this invention can be implemented by coating with resist material not only the frontside of the wafer (except for the contact regions), but also by coating the edges and the backside of the wafer, to prevent the removal of the silicon dioxide on these surfaces while etching the contact regions. The silicon dioxide then remains on the wafer throughout the remainder of the processing and acts as an insulating layer in accordance with the principles of this invention. As a result, the differential etching of metal layers connected to the backside of substrate 11 by paths of different resistivities is effectively eliminated.

It should be noted that while coatings 16 (FIG. 2), 18 (FIG. 5) and 23 (FIG. 7) are preferably leakproof, covering both the backside and the edges of wafer 10, and forming etchant-tight seals with any insulation on top of wafer 10, these coatings can leak without substantially degrading the process of this invention. Exposing small areas of the wafer edge or backside to etchant has only a small effect on the uniformity of the resulting etching because the high resistivity of these small areas ensures that only exceedingly small, substantially harmless, currents can flow.

Other implementations of this invention will be obvious in light of this disclosure.

What is claimed is:

1. In the method of etching portions of a metal layer formed only on the front surface of a slice of semiconductor material containing current conducting paths from its back surface to its front surface, said metal layer being separated in places from said semiconductor material by insulation and the etchant used being selected to substantially etch only the metal layer, comprising the steps of masking said metal layer and etching away the unmasked portions of said metal layer, the improvement comprising the steps of:

placing an insulation resistant to the etching solution on the edges and back side of said slice prior to submerging said slice in an etching solution, submerging the insulation coated slice in the etchant solution for removing the unmasked portions of the metal layer, and removing said slice from the etchant solution, said insulation preventing the formation of any electrochemical effects between the material to be etched and the substrate.

* * * * *